United States Patent [19]

Suganuma

[11] 4,195,274
[45] Mar. 25, 1980

[54] TEMPERATURE COMPENSATING CIRCUIT FOR VARACTOR DIODES

[75] Inventor: Hisashi Suganuma, Kawagoe, Japan

[73] Assignee: Pioneer Electronic Corporation, Tokyo, Japan

[21] Appl. No.: 930,115

[22] Filed: Aug. 1, 1978

[30] Foreign Application Priority Data

Aug. 1, 1977 [JP] Japan ............................ 52/81554

[51] Int. Cl.² ..................... H01V 3/00; H03K 3/26; H03H 5/12
[52] U.S. Cl. ................................ 334/15; 307/310; 307/320
[58] Field of Search ............... 334/15; 325/453, 464, 325/465; 307/259, 310, 320; 331/36 C, 177 V

[56] References Cited

U.S. PATENT DOCUMENTS

| | | | |
|---|---|---|---|
| 3,531,739 | 9/1970 | Groves | 334/15 |
| 3,534,295 | 10/1970 | Gregory | 334/15 |
| 3,697,890 | 10/1972 | Healey et al. | 331/177 V |

FOREIGN PATENT DOCUMENTS 1539858  4/1970 Fed. Rep. of Germany ............ 334/15

OTHER PUBLICATIONS

McMahon et al., "Voltage-Variable Capacitors-State of the Art," Electronic Industries, pp. 90-95, Dec. 1959.

Primary Examiner—Alfred E. Smith
Assistant Examiner—Harry E. Barlow
Attorney, Agent, or Firm—Sughrue, Rothwell, Mion, Zinn and Macpeak

[57] ABSTRACT

A temperature compensating circuit for a varactor diode having a voltage source applied to a temperature compensating diode which is provided separately from a control voltage for controlling the varactor diode and which is unaffected by a varactor diode controlling voltage source exhibiting a high impedance.

6 Claims, 11 Drawing Figures

TEMPERATURE COMPENSATING CIRCUIT FOR VARACTOR DIODES

BACKGROUND OF THE INVENTION

1. Field of the Invention

The present invention relates generally to temperature compensating circuits for varactor diodes, and more particularly, to temperature compensating circuits for varactor diode electronic tuning circuits.

2. Description of the Prior Art

A varactor diode is an electronic component whose static capacitance value is varied in a controlled fashion by a control voltage applied thereto. As such, the varactor diode is being used in numerous applications, for example, frequency multipliers, parametric amplifiers, frequency modulators, frequency sweeper circuits, electronic tuner systems, automatic frequency control circuits, automatic frequency and phase control circuits, and the like.

As is well known, the varactor diode has a negative temperature coefficient. That is to say, as the temperature of the environment surrounding the varactor is increased, the voltage drop across the anode and cathode of the varactor diode is decreased. Over certain temperature ranges the relationship between the temperature increase and voltage drop decrease is substantially linear.

When a varactor diode, for example, is used in an electronic tuner system where the frequency selected by the tuner is varied in accordance with the level of a control voltage, temperature compensation must be provided to the varactor diode so that the selected frequency does not change with temperature.

Various temperature compensation schemes have been employed to counteract the temperature sensitivity of the varactor diode, especially in the case where the varactor diode is used in an electronic tuner system. However, as is discussed in greater detail below, such conventional compensation schemes exhibit deficiencies.

SUMMARY OF THE INVENTION

It is an object of the present invention to provide a temperature compensating circuit for a varactor diode having a voltage source applied to a temperature compensating diode which is provided separately from a control voltage for controlling the varactor diode and which is unaffected by a varactor diode controlling voltage source exhibiting a high impedance.

It is a further object of the present invention to provide a temperature compensating circuit for a varactor diode in which a varactor controlling voltage source having a high impedance is connected in parallel to a temperature compensating circuit having a high output impedance, so that the capacitance value of the varactor diode can be selectively varied irrespective of the maximum voltage provided by the varactor controlling voltage source to the varactor diode.

The present invention relates to a temperature compensating circuit for a varactor diode, and for purposes of explanation, the varactor diode is employed as a tuning element in an electronic tuning system. Four embodiments are shown. The present invention provides a temperature compensating circuit for a varactor diode having a voltage source applied to a temperature compensating diode which is provided separately from a control voltage for controlling the varactor diode and which is unaffected by a varactor diode controlling voltage source exhibiting a high impedance. Particularly with respect to the fourth embodiment, the present invention provides a temperature compensating circuit for a varactor diode in which a varactor controlling voltage source having a high impedance is connected in parallel to a temperature compensating circuit having a high output impedance, so that the capacitance value of the varactor diode can be selectively varied irrespective of the maximum voltage provided by the varactor controlling voltage source to the varactor diode.

DETAILED DESCRIPTION OF THE INVENTION

The present invention provides several embodiments of a temperature compensating circuit for a varactor diode. While the varactor diode is employed in an electronic tuning system, it should be understood that the present invention is equally applicable in other varactor diode applications where temperature compensation is desired.

Figure 1:
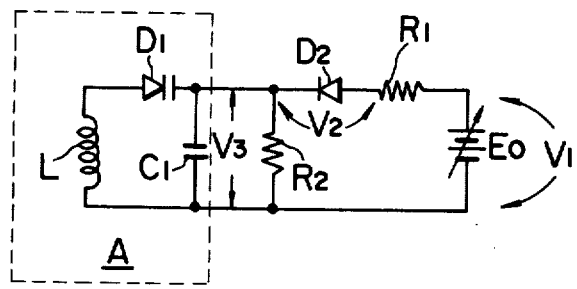
FIG. 1 is a schematic diagram of a conventional electronic tuning system employing a varactor diode as the tuning element.

For explanation purposes, a conventional electronic tuning system is shown in FIG. 1, and includes a tuning circuit A having a tuning coil L, a capacitor $C_1$ for bypassing high frequencies, and a varactor diode $D_1$, and also includes a station selecting variable voltage source $E_0$ having an output voltage applied through a resistor $R_1$ and a diode $D_2$ to the tuning circuit A. By utilizing the positive temperature coefficient of the diode $D_2$, the temperature compensation of the varactor diode $D_1$ is achieved. In general, because the resistance $R_1$ of the signal source is a low independance value, the following relation can be obtained:

$$V_3 \approx V_1 - V_2 \qquad (1)$$

where $V_1$ is the voltage of the station selecting variable voltage source, $V_2$ is the voltage across diode $D_2$, and $V_3$ is the voltage across varactor diode $D_1$.

Thus, for example, when the temperature coefficient of the varactor diode $D_1$ varies at a rate of $-2$ mV/°C., the voltage $V_3$ is made to vary at a corresponding rate of $+2$ mV/°C. by utilizing the temperature coefficient of the diode $D_2$, thereby cancelling the temperature coefficient variation of the varactor $D_1$.

In the conventional circuit shown in FIG. 1, no trouble is encountered when the station selecting variable voltage source resistance $R_1$ is low; however, when the resistance $R_1$ is a high impedance value, the voltage $V_3$ produced across resistor $R_2$ can be expressed by the following equation:

$$V_3 \approx V_1 \cdot R_2/(R_1 + R_2) \qquad (2)$$

Thus, as shown by equation (2) above, when the impedance value of resistor $R_1$ is a high value, $V_3 << V_1$. Therefore, in the case where the amplitude level of the station selecting variable voltage source $E_0$ is limited, it is impossible to obtain the necessary voltage $V_3$ to be applied to the varactor diode $D_1$ to control selecting the capacitance exhibited thereby. Furthermore, in this case, the electric current supplied to the temperature compensating diode $D_2$ by the voltage source $E_0$ is considerably decreased, which makes the required temperature compensation produced by temperature compensating diode $D_2$ impossible to obtain.

The first preferred embodiment of the temperature compensating circuit for a varactor diode of the present invention when the varactor diode is employed as the tuning element in an electronic tuning system is now described with reference to FIG. 2.

Figure 2:
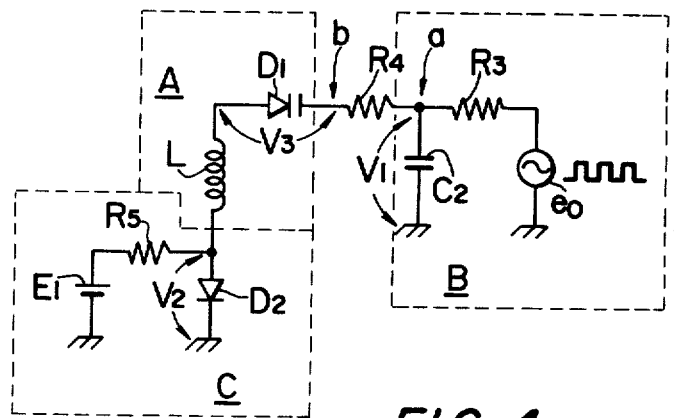
FIG. 2 is a schematic diagram of the first embodiment of the temperature compensating circuit for a varactor diode of the present invention where the varactor diode is employed as a tuning element in an electronic tuning system.
Figure 3A:
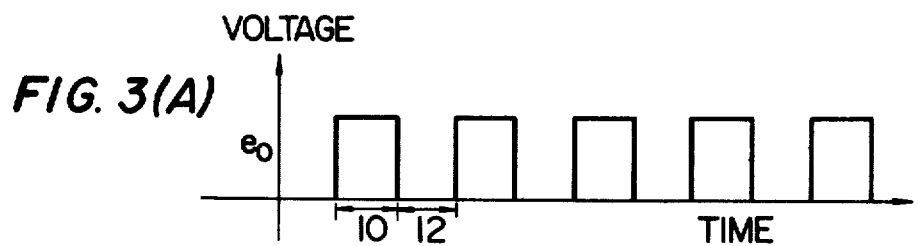
FIGS. 3A and 3B plot the amplitude on the vertical axis versus time on the horizontal axis of the output pulse train provided by the signal source $e_0$ at the high frequency and low frequency selection points, respectively.
Figure 3B:
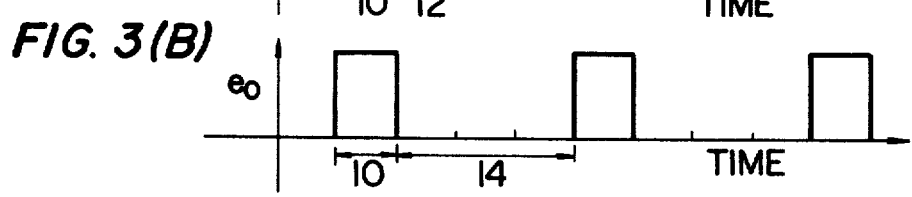
Figure 3C:
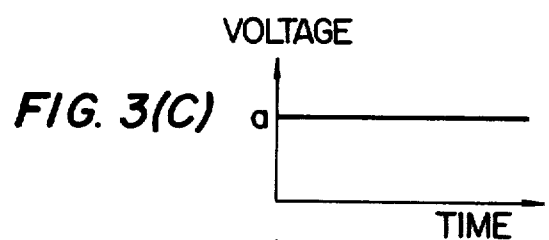
FIGS. 3C and 3D plot the control voltage level at node a of FIG. 2 at the high frequency and low frequency selection points, respectively.
Figure 3D:
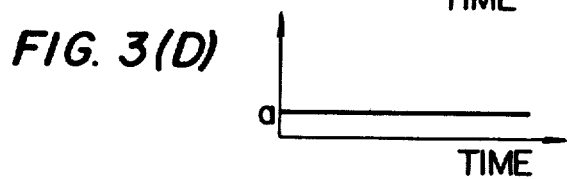

As shown in FIGS. 2, 3A and 3B, the signal source $e_0$ of the station selection variable voltage source B for controlling the capacitance value produced by a varactor diode $D_1$ in the tuning section B of an electronic tuning system produces a square wave output voltage having a constant amplitude and a constant ON time 10. The OFF time of the signal source $e_0$ is changed in order to cause the varactor diode $D_1$ of the tuning section B to select a different frequency. Specifically, when a high frequency signal is desired to be selected, signal source $e_0$ is adjusted so that the output pulse train has a short OFF time 12, and, thus, a high duty cycle, as shown in FIG. 3A. In comparison, when a low frequency signal is desired to be selected, signal source $e_0$ is adjusted so that the output pulse train has a long OFF time 14, and, thus, a low duty cycle, as shown in FIG. 3B. The control pulse train provided by signal source $e_0$ is smoothed by means of a high impedance resistor $R_3$ and a capacitor $C_2$, and a high voltage level is thus provided at point a when a high frequency signal is selected, as shown in FIG. 3C, while a low voltage level is thus provided at point a when a low frequency selection signal is is selected, as shown in FIG. 3D. In this case, the smoothing circuit has a high impedance, and the electric source B serves as a kind of digital-to-analog converter.

In a temperature compensating circuit C of the first embodiment of the present invention, as shown in FIG. 2, biasing of a temperature compensating diode $D_2$ is effected through a resistor $R_5$ by means of an electric source $E_1$ having a constant voltage output, and the anode of the diode $D_2$ connected via inductor L to the anode of a varactor diode $D_1$.

It is assumed that the temperature coefficient of the varactor diode $D_1$ is negative and has a value of $-2$ mV/°C. In this case, if the temperature is raised by one (1) degree centigrade, a voltage drop $V_3$ across the varactor diode $D_1$ is decreased by 2 mV. Accordingly, the capacitance of the varactor diode $D_1$ is increased, and, therefore, the tuning frequency selected thereby is deviated from the desired tuning frequency. Therefore, to have the desired frequency selected, it is necessary to increase the voltage $V_3$ by an amount of 2 mV/°C. from the control voltage applied to varactor diode $D_1$.

It should be noted that the impedance value of the resistor $R_4$ applying the control voltage from point a to the cathode of the varactor diode $D_1$ at point b is a very high value, but that the reverse current of the varactor diode $D_1$ is very small. Thus, the voltage drop across the resistor $R_4$ can be neglected for all practical purposes. In other words, the potential level at point b can be regarded as being equal to the voltage $V_1$ across capacitor $C_2$ at point a. Accordingly, in the first embodiment of the present invention it is necessary only to decrease the voltage $V_2$ at a rate of 2 mV/°C. If a bias voltage is applied to the diode $D_2$ so that it exhibits the same temperature negative coefficient ($-2$ mV/°C.) as that exhibited by varactor diode $D_1$, when the temperature increases by one (1) degree centigrade, the voltage $V_2$ is decreased by 2 mV. Thus, the above-described requirement is satisfied, and the effect of the temperature of the varactor $D_1$ is cancelled in the first embodiment of the present invention.

Figure 4:
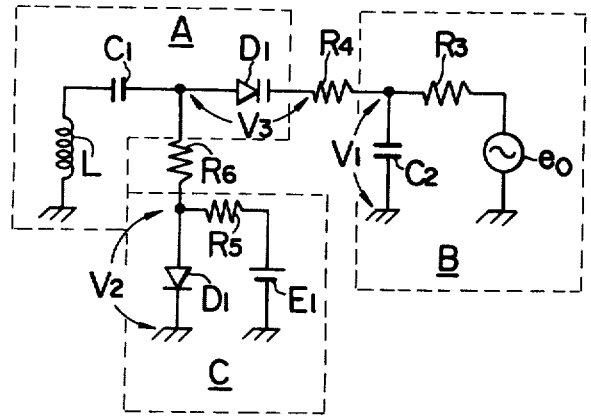
FIG. 4 is a schematic diagram of the second embodiment of the temperature compensating circuit for a varactor diode of the present invention where the varactor diode is employed as a tuning element in an electronic tuning system.

The second embodiment of the temperature compensating circuit for a varactor diode of the present invention when the varactor diode is employed as the tuning element in an electronic tuning system is now described with reference to FIG. 4. In this embodiment, the temperature compensating circuit C is connected through a resistor $R_6$ to the anode of the varactor diode $D_1$, so that the temperature compensating circuit C is connected in parallel with the inductor L. In this embodiment, resistor $R_6$ serves to make the anode potential of varactor diode $D_1$ equal to the voltage $V_2$ present across capacitor $C_2$ in the DC mode, and its impedance value is selected so as not to effect the tuning circuit A. The operation of the circuit of the second embodiment, as shown in FIG. 4, is similar to that of the first embodiment, as shown in FIG. 2.

Thus, in the first and second embodiments of the temperature compensating circuit for a varactor diode of the present invention, a diode is connected between the anode side of the varactor diode and electrical ground in such a manner that the bias direction of the diode is opposite to that of the varactor diode, and a bias voltage for temperature compensation is applied to the diode from a constant voltage source. Thus, the voltage source for the temperature compensating circuit is independent of station selection variable voltage source. Accordingly, even in the case where the station selection variable voltage source has a high impedance, it is unnecessary to increase the voltage provided by the variable voltage source because the temperature coefficient of the varactor diode can be compensated for by the temperature compensating circuit.

The third embodiment of the temperature compensating circuit for a varactor diode of the present invention when the varactor diode is employed as the tuning element in an electronic tuning system is now described with reference to FIG. 5. Like components have like reference designations between FIGS. 4 and 5.

Figure 5:
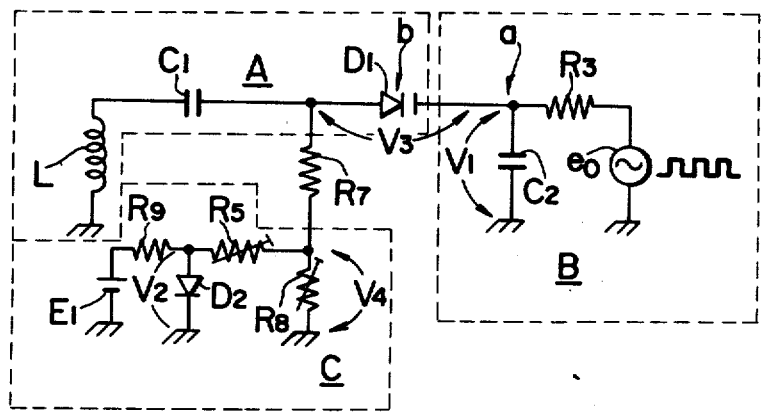
FIG. 5 is a schematic diagram of a third embodiment of the temperature compensating circuit for a varactor diode of the present invention where the varactor diode is employed as a tuning element in an electronic tuning system.

As shown in FIG. 5, in a temperature compensating circuit C, a bias voltage is applied to a temperature compensating diode $D_2$ by a constant voltage source $E_1$, and the voltage present across diode $D_2$ is subjected to voltage division by resistors $R_5$ and $R_8$, so that the resultant voltage $V_4$ at the junction of resistors $R_5$, $R_8$ is applied to the anode of the varactor diode $D_1$.

As is the case above, it is assumed that the negative temperature coefficient of the varactor $D_1$ is $-2$ mV/°C. Thus, if the temperature increases by one (1) degree centigrade, the voltage drop $V_3$ across the varactor diode $D_1$ is decreased by 2 mV. As a result, the capacitance of the varactor diode $D_1$ is increased, and the tuning frequency selected by the varactor diode $D_1$ is shifted from the desired tuning frequency. Accordingly, in this third embodiment, it is necessary to increase the voltage $V_3$ by 2 mV for each degree centigrade.

It should be noted that the value of the resistor $R_3$ of the station selection variable voltage source $B_1$ is a very high value, but that the reverse current of the varactor diode $D_1$ is very small. Thus, the voltage drop across the resistor $R_3$ can be neglected for all practical purposes, and the potential at the point b can, therefore, be regarded as being equal to the voltage $V_1$ at the point a. Accordingly, all that is necessary for temperature compensation is to decrease the voltage $V_4$ at the voltage-division point, which is obtained by subjecting the voltage $V_2$ to voltage division by resistors $R_5$ and $R_8$, and by selecting the values for resistors $R_5$ and $R_8$ so that the voltage $V_4$ increases by an amount of 2 mV per degree centigrade. In this case, if a suitable bias voltage is applied to the diode $D_2$, the voltage $V_4$ increases by an amount equal to but opposite in sign to the temperature coefficient of the varactor diode $D_1$, i.e., the voltage $V_4$ increases by 2 mV/°C. Thus, the effect of the negative temperature coefficient of the varactor diode $D_1$ is cancelled.

Accordingly, in the third embodiment of the present invention, the temperature coefficient of the varactor diode $D_1$ does not necessarily have to be equal to that of the temperature compensating diode $D_2$. That is, if the temperature coefficient of the diode $D_2$ is higher than that of the varactor diode $D_1$, by using the voltage divider of resistors $R_5$, $R_8$, the level of the voltage $V_4$ can be made to vary so that the effect of the temperature on varactor diode $D_1$ can be cancelled.

Thus, in the third embodiment of the temperature compensating circuit for a varactor diode of the present invention, the voltage provided across the temperature compensating diode $D_2$ by the constant voltage source $E_1$ is voltage divided by resistors $R_5$ and $R_8$, and the resultant voltage $V_4$ is applied to the varactor diode $D_1$. Thus, the voltage source or the temperature compensating circuit C is separate from the station selection variable voltage source. Even if the station selection variable voltage source has a high impedance, it is unnecessary to increase the voltage provided by square wave voltage source $e_0$ and the temperature coefficient of the temperature compensating circuit can be selected independently of the station selection variable voltage source. Furthermore, according to the third embodiment, the voltage $V_2$ across the temperature compensating diode $D_2$ is applied through the voltage divider $R_5$, $R_8$ to the varactor diode $D_1$, and, therefore, it is not necessary to make the temperature coefficient of the temperature compensating diode $D_2$ coincident with that of the varactor diode $D_1$, that is, the temperature coefficient of the temperature compensating diode $D_2$ can be readily adjusted so as to be equal to that of the varactor diode $D_1$ by utilizing the voltage dividing resistors $R_5$ and $R_8$.

Figure 6:
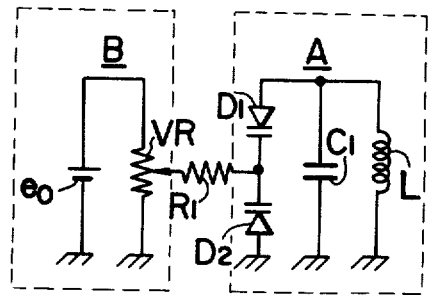
FIGS. 6 and 7 are schematic diagrams of conventional electronic tuning systems employing a varactor diode as the tuning element and having a temperature compensating capability.
Figure 7:
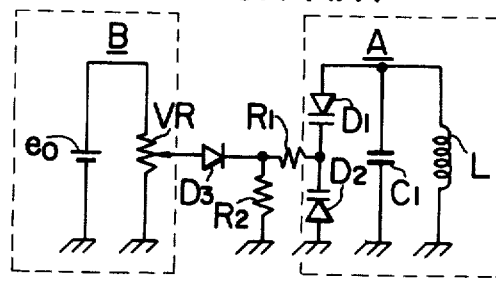

FIGS. 6 and 7 show other conventional temperature compensating circuits for a varactor diode where the varactor diode is used in an electronic tuning system.

Referring now to the conventional circuit shown in FIG. 6, the voltage provided by a constant electric source $e_0$ is controllably divided by the arm of a variable resistor VR, and the resultant voltage on the arm is applied as a reverse bias voltage to the cathodes of varactors diodes $D_1$ and $D_2$ so as to control the frequency $f_0$ of a tuning circuit A. In this conventional circuit, temperature compensation of the varactor diodes $D_1$ and $D_2$ is achieved by a fixed capacitor $D_1$ having a constant temperature coefficient. However, in this circuit, it is difficult to compensate for the negative temperature coefficient exhibited by each of the varactor diodes $D_1$ and $D_2$ (e.g. $-2$ mV/°C.) uniformly over the signal receiving frequency band.

The conventional circuit shown in FIG. 7 has been provided to eliminate the temperature compensation deficiencies present in the circuit shown in FIG. 6. In the conventional circuit of FIG. 7, a diode $D_3$ is connected in series with the output voltage from the station selection variable voltage source B, and the output voltage is applied to a voltage divider of resistors $R_1$ and $R_2$. The voltage developed across resistor $R_2$ is changed at a rate of about $-2$ mV/°C. due to the temperature coefficient of diode $D_3$, and the developed voltage acts to cancel the temperature variation of about $-2$ mV/°C. of each of the varactor diodes $D_1$ and $D_2$. In this conventional circuit, it is possible to achieve the temperature compensation over the entire signal receiving frequency band.

The temperature compensation approach of the conventional circuit of FIG. 7 can be employed where the impedance of the station selection variable voltage source B is a low value and the range of the voltage provided by the voltage source $e_0$ is not limited. However, it is necessary to provide a current having a minimum value to the temperature compensating diode $D_3$ in order to achieve the desired temperature compensation. Therefore, in the case where the impedance of the station selecting variable voltage source B is a relatively high value, the voltage drop is increased thereby and it is difficult to provide the predetermined voltage across resistor $R_2$. As a result, the range of the control voltage applied to the varactor diodes $D_1$ and $D_2$ is decreased considerably.

The small range of the control voltage may be prevented by increasing the impedance of resistor $R_2$. However, this results in a decrease in the amount of current supplied to diode $D_3$, whereby the required temperature compensation produced by diode $D_3$ cannot be achieved. Furthermore, it usually is not practical to increase the voltage of the constant voltage source $e_0$.

The fourth embodiment of the temperature compensating circuit for a varactor diode of the present invention when the varactor diode is employed as tuning element in an electronic tuning system is now described with reference to FIG. 8.

Figure 8:
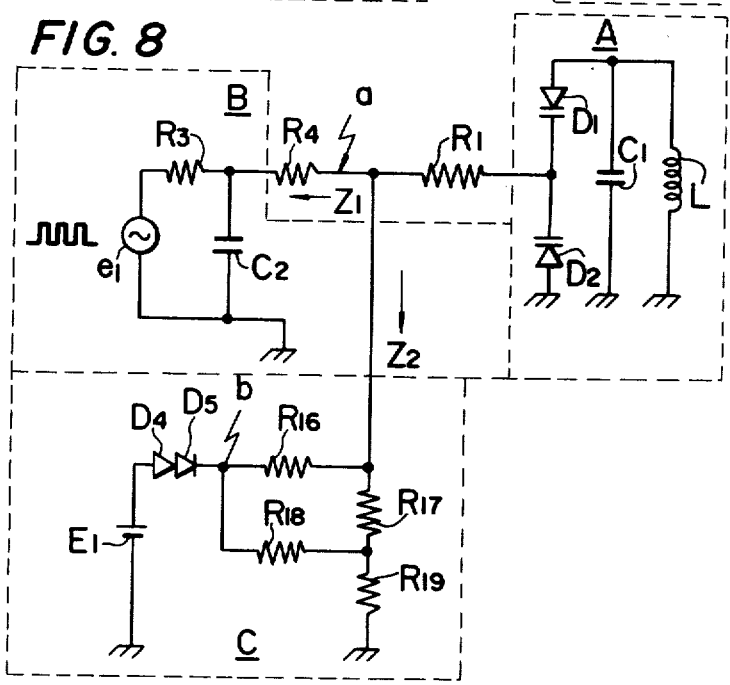
FIG. 8 is a schematic diagram of a fourth embodiment of the temperature compensating circuit for a varactor diode of the present invention where the varactor diode is employed as a tuning element in an electronic tuning system.

As shown in FIG. 8, the station selecting variable voltage source B is substantially identical in construction and operation to that of the station selecting variable voltage B of the first and second embodiments of the present invention, as shown in FIGS. 2 and 4, respectively.

In a temperature compensating circuit C, the impedance values of resistors $R_{16}$ through $R_{19}$ are selected so as to satisfy the relationship of $R_{16}, R_{17} > R_{18}, R_{19}$. In addition, the impedance $Z_2$ of the temperature compensation circuit C is set to be substantially equal to the impedance $Z_1$ of the station selecting variable voltage source B. The impedance values of resistors $R_{18}$ and $R_{19}$ selected are to be relatively small values so that temperature compensating diodes $D_4$ and $D_5$ are furnished with sufficient current so as to provide the desired temperature compensation characteristics.

A constant voltage source $E_1$ provides a fixed bias to the temperature compensating diodes $D_4$ and $D_5$ and thus, provides a fixed bias to varactor diodes $D_1$ and $D_2$. In addition, the voltage provided by constant voltage source $E_1$ is selected so that the varactor diodes $D_1$ and $D_2$ operate correctly even if the voltage from the station selecting variable voltage source B is close to zero volts. The bias provided to the varactor diodes $D_1$ and $D_2$ is determined by the voltage division ratio of the impedance values of the resistors $R_{16}$ and $R_{17}$, while the bias provided to the diodes $D_4$ and $D_5$ is determined by the impedance values of the resistors $R_{18}$ and $R_{19}$.

If the voltage drops across the varactor diodes $D_1$ and $D_2$ vary with respect to temperature at a rate of $-2$ mV/°C., the voltage at point a must be varied at the rate of $-2$ mV/°C. in order to provide temperature compensation. Thus, if the temperature coefficients of each of the temperature compensating diodes $D_4$ and $D_5$ is $+2$ mV/°C., then the voltage variation produced at point b has a rate of 4 mV/°C. Accordingly, it is necessary to set the attenuation ratio of the resistors $R_{16}$ through $R_{19}$ to "½." Furthermore, if three temperature compensating diodes are employed, the attenuation ratio must be set at "⅓." In other words, the number of temperature compensating diodes is inversely proportional to the attenuation ratio of resistors $R_{16}$ through $R_{19}$.

If the voltage variation produced by the station selecting variable voltage source B is from 0 V to 10 V, a voltage varying within a range of from 2 V to 9 V is applied to the varactor diodes $D_1$ and $D_2$ due to the bias voltage provided through resistors $R_{16}$ through $R_{19}$ by the constant voltage source $E_1$. In this case, temperature compensation is produced by the diodes $D_4$ and $D_5$. Furthermore, because the impedance $Z_2$ of the temperature compensating circuit C can be increased in response to an increase in the impedance $Z_1$, it is unnecessary to increase the level of the square wave pulse train provided by the voltage source $e_1$ of the station selecting variable voltage source B. In addition, it is possible to carry out the temperature compensation with high accuracy in the fourth embodiment of the present invention by suitably selecting the number of temperature compensating diodes and the attenuation ratio of the resistors $R_{16}$ through $R_{19}$.

What is claimed is:

1. A temperature compensating circuit for a tuning circuit having a varactor diode, comprising:

(a) a varactor diode having an anode and a cathode and exhibiting a negative temperature coefficient, said varactor diode being responsive to a control voltage applied to its cathode for producing a capacitance value in accordance with the value of said control voltage;

(b) temperature compensating means for providing a biasing voltage to the anode of said varactor diode, said biasing voltage having an amplitude level controlled to compensate substantially for the temperature sensitivity of said varactor diode, said temperature compensating means including a constant voltage source having positive and negative terminals, a first resistor and a temperature compensating diode having an anode and a cathode and exhibiting a negative temperature coefficient, said negative terminal and the cathode of said temperature compensating diode being connected to ground and said biasing voltage provided by said temperature compensating means being present at the anode of said temperature compensating diode, said negative temperature coefficient of said temperature compensating diode being substantially equal to the negative temperature coefficient of said varactor diode, said first resistor being connected between said positive terminal and the anode of said temperature compensating diode; and (c) a second resistor connected between the anode of said temperature compensating diode and the anode of said varactor diode for coupling the biasing voltage to the anode of said varactor diode, said second resistor having a resistance value high enough to prevent said temperature compensating means from interfering with the tuning operation of said tuning circuit.

2. A temperature compensating circuit for a varactor diode, comprising:

(a) a varactor diode having an anode and a cathode and exhibiting a negative temperature coefficient, said varactor diode being responsive to a control voltage applied to its cathode for producing a capacitance value in accordance with the value of said control voltage;

(b) temperature compensating means for providing a biasing voltage to the anode of said varactor diode, said biasing voltage having an amplitude level controlled to compensate substantially for the temperature sensitivity of said varactor diode;

said temperature compensating means including constant voltage source means for providing a constant positive direct current voltage as an output, a temperature compensating diode having an anode and a cathode and exhibiting a negative temperature coefficient, said anode being responsive to said output of said constant voltage source means and said cathode being connected to an electrical ground, and voltage divider means connected to said anode of said temperature compensating diode for voltage dividing said voltage present at said anode such that said divided voltage has a variation that is substantially opposite to said negative coefficient of said varactor diode, said divided voltage being provided to said anode of said varactor diode.

3. A temperature compensating circuit for a varactor diode, comprising:

(a) varactor diode means responsive to a control voltage for producing a capacitance value in accordance with the value of said control voltage; and (b) temperature compensating means for providing a biasing voltage to said varactor diode means, said biasing voltage having an amplitude level controlled to compensate substantially for the temperature sensitivity of said varactor diode means;

said temperature compensating means including constant voltage source means for providing a constant positive direct current voltage as an output, a temperature compensating diode means having an anode terminal and a cathode terminal and exhibiting a negative temperature coefficient, said anode terminal of said temperature compensating diode being connected to said output of said constant voltage source means, and voltage divider means connected to said cathode terminal of said temperature compensating diode means for providing a low current voltage divider path and a high current voltage divider path, said biasing voltage being provided by said low current voltage divider path.

4. The circuit as recited in claim 2, wherein said voltage divider means comprises two variable resistance elements.

5. The circuit as recited in claim 3, wherein said varactor diode means includes a first varactor and a second varactor diode for producing together said capacitive value, said first varactor diode having a cathode and an anode exhibiting a first negative temperature coefficient, and said second varactor diode having a cathode and an anode and exhibiting a second negative temperature coefficient.

6. The circuit as recited in claim 3, wherein said control voltage of said varactor diode means is provided to said cathode of said first varactor diode and to said cathode of said second varactor diode, and wherein said biasing voltage of said temperature compensating means is provided to said cathode of said first varactor diode and to said cathode of said second varactor diode.

* * * * *